US011996809B2

(12) United States Patent
Morisawa et al.

(10) Patent No.: US 11,996,809 B2
(45) Date of Patent: May 28, 2024

(54) POWER AMPLIFIER CIRCUIT

(71) Applicant: Murata Manufacturing Co., Ltd., Kyoto (JP)

(72) Inventors: Fuminori Morisawa, Kyoto (JP); Kazuhiko Ishimoto, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 523 days.

(21) Appl. No.: 17/230,101

(22) Filed: Apr. 14, 2021

(65) Prior Publication Data

US 2021/0234523 A1 Jul. 29, 2021

Related U.S. Application Data

(63) Continuation of application No. PCT/JP2019/040386, filed on Oct. 15, 2019.

(30) Foreign Application Priority Data

Oct. 17, 2018 (JP) .................................. 2018-196113

(51) Int. Cl.
*H03F 1/02* (2006.01)
*H03F 1/52* (2006.01)
(Continued)

(52) U.S. Cl.
CPC ........... *H03F 3/245* (2013.01); *H03F 1/0233* (2013.01); *H03F 1/52* (2013.01); *H03F 3/195* (2013.01);
(Continued)

(58) Field of Classification Search
CPC .......... H03F 3/245; H03F 1/0233; H03F 1/52; H03F 3/195
See application file for complete search history.

(56) References Cited

U.S. PATENT DOCUMENTS

2004/0075501 A1* 4/2004 Takahashi ............ H03G 3/3047
330/279
2007/0052481 A1* 3/2007 Newman ................ H03F 3/189
330/298

(Continued)

FOREIGN PATENT DOCUMENTS

CN 104641553 A 5/2015
JP H08-331758 A 12/1996
(Continued)

OTHER PUBLICATIONS

International Search Report for PCT/JP2019/040386 dated Dec. 24, 2019.
Written Opinion for PCT/JP2019/040386 dated Dec. 24, 2019.

*Primary Examiner* — Patricia T Nguyen
(74) *Attorney, Agent, or Firm* — Pearne & Gordon LLP

(57) ABSTRACT

There is provided a power amplifier circuit with improved operation speed of the protection function against overcurrent or overvoltage. The power amplifier circuit includes an amplifier configured to amplify a radio frequency signal and output the radio frequency signal, a bias current supply circuit configured to supply a bias current to the amplifier, a detection circuit configured to detect whether the current or voltage of the amplifier is equal to or greater than a predetermined threshold; and a draw circuit configured to, when the detection circuit detects that the current or voltage is equal to or greater than the predetermined threshold, draw at least a part of the bias current supplied to the amplifier.

14 Claims, 9 Drawing Sheets

(51) Int. Cl.
*H03F 3/195* (2006.01)
*H03F 3/24* (2006.01)

(52) U.S. Cl.
CPC .. *H03F 2200/451* (2013.01); *H03F 2200/462* (2013.01); *H03F 2200/84* (2013.01)

(56) References Cited

U.S. PATENT DOCUMENTS

| | | | |
|---|---|---|---|
| 2015/0038092 A1* | 2/2015 | Andrys | H03F 1/0233 327/318 |
| 2015/0070092 A1 | 3/2015 | Shimoto et al. | |
| 2016/0322944 A1 | 11/2016 | Hase | |
| 2017/0126183 A1 | 5/2017 | Honda | |
| 2019/0280658 A1* | 9/2019 | Morisawa | H03F 1/523 |
| 2020/0186090 A1* | 6/2020 | Choi | H03F 1/0272 |
| 2020/0336122 A1* | 10/2020 | Lin | H03F 1/0233 |
| 2020/0412304 A1* | 12/2020 | Soga | H03F 3/245 |

FOREIGN PATENT DOCUMENTS

| | | |
|---|---|---|
| JP | H09-199950 A | 7/1997 |
| JP | 2002-335135 A | 11/2002 |
| JP | 2016-213557 A | 12/2016 |
| JP | 2017-092526 A | 5/2017 |
| WO | 2015/002294 A1 | 1/2015 |

\* cited by examiner

POWER AMPLIFIER CIRCUIT

CROSS REFERENCE TO RELATED APPLICATION

This is a continuation of International Application No. PCT/JP2019/040386 filed on Oct. 15, 2019 which claims priority from Japanese Patent Application No. 2018-196113 filed on Oct. 17, 2018. The contents of these applications are incorporated herein by reference in their entireties.

BACKGROUND

Technical Field

The present disclosure relates to a power amplifier circuit.

In mobile communication devices, such as mobile phones, power amplifier circuits are used to amplify power of radio-frequency (RF) signals to be transmitted to base stations.

For example, Patent Document 1 describes a protection circuit for an amplifier. The protection circuit includes a drain current detector configured to detect drain current in a power amplifier, a comparator configured to output a comparison result obtained by comparing a detection signal with a reference voltage, and a switching circuit provided between a power supply and the power amplifier. The comparator inputs an output signal representing the comparison result to the switching circuit through a latch circuit. When the drain current detector detects overcurrent, the comparator outputs an output signal of a level "H", the signal is inputted to the switching circuit, and accordingly, the switching circuit disconnects the power amplifier from the power supply. In this manner, the amplifier is protected from excess drain current.

Patent Document 1: Japanese Unexamined Patent Application Publication No. 9-199950

BRIEF SUMMARY

However, in the protection circuit described in Patent Document 1, the switching circuit is provided on the drain side with respect to the amplifier, and as a result, time delay occurs. Additionally, when the switching circuit is provided on the drain side with respect to the amplifier, loss (decrease in output) may by caused by the resistive component, and as a result, the RF characteristic may be degraded.

The present disclosure provides a power amplifier circuit with improved operation speed of the protection function against overcurrent or overvoltage.

A power amplifier circuit according to an aspect of the present disclosure includes an amplifier configured to amplify a radio frequency signal and output the radio frequency signal, a bias current supply circuit configured to supply a bias current to the amplifier, a detection circuit configured to detect whether the current or voltage supplied to the amplifier is equal to or greater than a predetermined threshold; and a draw circuit configured to, when the detection circuit detects that the current or voltage is equal to or greater than the predetermined threshold, draw at least a part of the bias current supplied to the amplifier.

With this aspect, when overcurrent or overvoltage is detected, the draw circuit directly draws the bias current supplied from the bias current supply circuit to the amplifier so as to stop the operation of the amplifier, and as a result, the operation speed of the protection function against overcurrent or overvoltage is improved.

The present disclosure can provide a power amplifier circuit with improved operation speed of the protection function against overcurrent or overvoltage.

DETAILED DESCRIPTION

Figure 1:
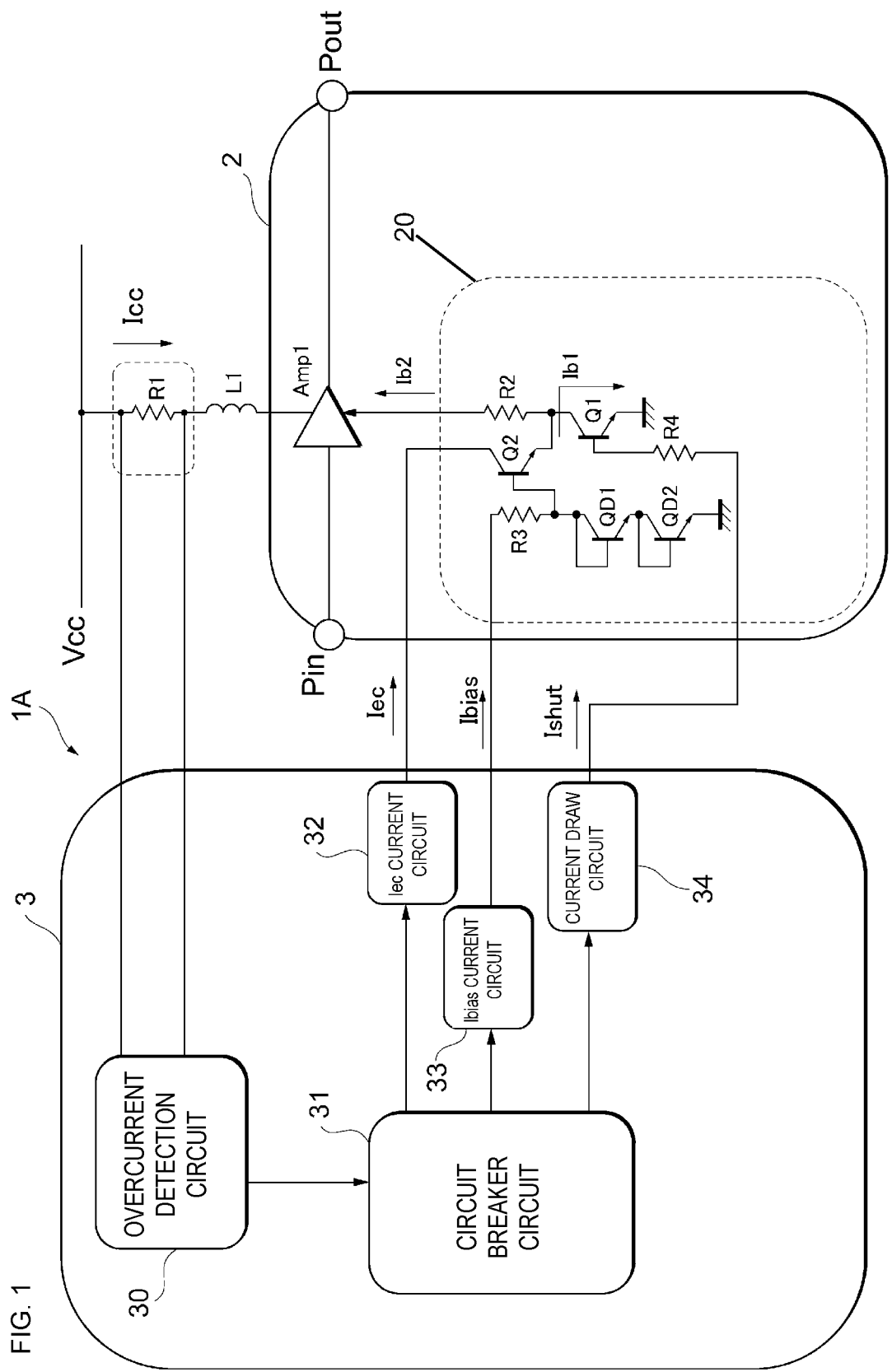
FIG. 1 illustrates an example of an overview of a circuit configuration of a power amplifier circuit 1A according to a first embodiment.

Embodiments of the present disclosure will be described with reference to the accompanying drawings. (In the drawings, configurations assigned the same reference characters are identical or similar configurations.)

First Embodiment (1) Configuration
(1-1) Power Amplifier Circuit 1A

FIG. 1 illustrates an example of an overview of a circuit configuration of a power amplifier circuit 1A according to a first embodiment. As illustrated in FIG. 1, the power amplifier circuit 1A includes, for example, an amplification unit 2, a control unit 3, a current detection element R1, and an inductor L1.

(1-2) Amplification Unit 2

The amplification unit 2 includes, for example, a power amplifier Amp1 and a bias current supply circuit 20.

(1-2-1) Power Amplifier Amp1

The power amplifier Amp1 (amplifier) is constituted by, for example, a transistor. A supply voltage Vcc is supplied to the power amplifier Amp1 via the current detection element R1 and the inductor L1. A current Icc caused by the supply voltage Vcc flows in the power amplifier Amp1. The power amplifier Amp1 receives an input signal Pin of a radio frequency signal (RF signal), amplifies the signal, and accordingly outputs an output signal Pout.

(1-2-2) Bias Current Supply Circuit 20

The bias current supply circuit 20 is a circuit for supplying a bias current Ib2 to the power amplifier Amp1. The bias current supply circuit 20 includes, for example, transistors Q1, Q2, QD1, and QD2 and resistance elements R2, R3, and R4.

As for the transistor Q2 (first transistor), the collector is coupled to an Iec current circuit 32 described later, the emitter is coupled to the power amplifier Amp1 via the resistance element R2, and the base is coupled to an Ibias current circuit 33 via the resistance element R3. The Iec current circuit 32 supplies a collector current Iec to the transistor Q2, while the Ibias current circuit 33 supplies a base current Ibias to the transistor Q2. The transistor Q2 supplies the bias current Ib2 from the emitter to the power amplifier Amp1 via the resistance element R2. It should be noted that the transistor Q2 may be a field-effect transistor (FET). In this case, the collector is regarded as the drain, the emitter as the source, and the base as the gate.

As for the transistor Q1 (second transistor), the collector is coupled between the transistor Q2 and the resistance element R2, the emitter is coupled to GND (grounded), and the base is coupled to a current draw circuit 34 via the resistance element R4. Under a predetermined condition, the current draw circuit 34 supplies a current Ishut to the base of the transistor Q1. When the current Ishut is supplied, the transistor Q1 turns on and draws a current Ib1 (collector current of the transistor Q1) from the bias current Ib2 to be supplied to the power amplifier Amp1. It should be noted that the transistor Q1 may be a FET. In this case, the collector is regarded as the drain, the emitter as the source, and the base as the gate. To turns on the FET, the current draw circuit 34 supplies voltage.

(1-3) Control Unit 3

Figure 2:
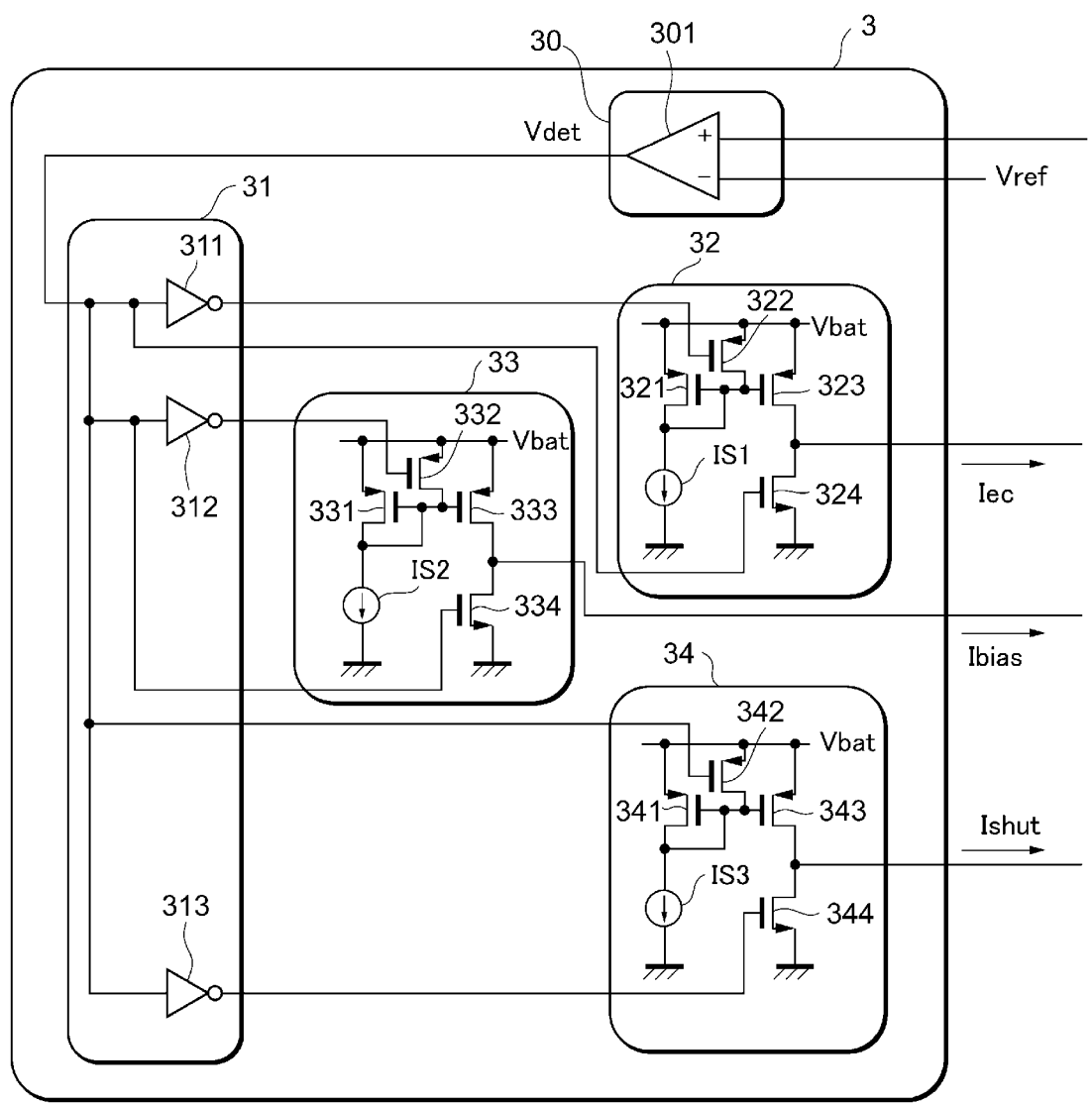
FIG. 2 illustrates an example of configurations of circuits included in a control unit 3.

FIG. 2 illustrates an example of configurations of circuits included in the control unit 3. As illustrated in FIG. 2, the control unit 3 includes, for example, an overcurrent detection circuit 30, a circuit breaker circuit 31, the Iec current circuit 32, the Ibias current circuit 33, and the current draw circuit 34.

(1-3-1) Overcurrent Detection Circuit 30

The overcurrent detection circuit 30 detects a current flowing in the power amplifier Amp1 by using the current detection element R1 and outputs a signal representing the detection result to the circuit breaker circuit 31. The overcurrent detection circuit 30 includes, for example, the current detection element R1 and a comparator 301. The current detection element R1 is a resistance element. As illustrated in FIG. 1, the supply voltage Vcc is supplied to one end of the current detection element R1, and the other end of the current detection element R1 is coupled to one end of the inductor L1. A non-inverting input terminal of the comparator 301 is coupled between the current detection element R1 and the inductor L1. A reference voltage Vref is supplied to an inverting input terminal of the comparator 301. In accordance with the comparison result obtained by using the non-inverting and inverting input terminals, the comparator 301 outputs a voltage Vdet of a level H (High) or level L (Low). The reference voltage Vref can be determined to inversely change an output voltage Vdet from the comparator 301 when the current Icc flowing in the power amplifier Amp1 is equal to or greater than a predetermined threshold (overcurrent). Specifically, the overcurrent detection circuit 30 detects a current flowing in the power amplifier Amp1 and outputs an output signal from the comparator 301 as the detection result to the circuit breaker circuit 31. For this, the overcurrent detection circuit 30 compares a voltage caused by voltage drop at the current detection element R1 with the reference voltage Vref and accordingly outputs a Vdet signal of the level H or the level L. Hence, it is desirable that the resistance of the current detection element R1 not greatly vary and the resistance value be relatively small (approximately 10 to 30 mΩ).

(1-3-2) Circuit Breaker Circuit 31

The circuit breaker circuit 31 outputs control signals to the Iec current circuit 32, the Ibias current circuit 33, and the current draw circuit 34, which will be described later, in accordance with the detection result outputted by the overcurrent detection circuit 30. The circuit breaker circuit 31 includes, for example, inverters 311, 312, and 313. The inverters 311, 312, and 313 are logic gates configured to inversely convert the level of input voltage and output the voltage. Specifically, the inverters 311, 312, and 313 output a voltage of the level L when a voltage of the level H is inputted; the inverters 311, 312, and 313 output a voltage of the level H when a voltage of the level L is inputted. The inverter 311 outputs a control signal from each of the input and output ends to the Iec current circuit 32. The inverter 312 outputs a control signal from each of the input and output ends to the Ibias current circuit 33. The inverter 313 outputs a control signal from each of the input and output ends to the current draw circuit 34.

(1-3-3) Iec Current Circuit 32

The Iec current circuit 32 includes, for example, a constant-current power supply IS1, P-channel metal-oxide-semiconductor field-effect transistors (MOSFETs) 321, 322, and 323 and an N-channel MOSFET 324. The P-channel MOSFETs 321 and 323 are an example of a "third transistor" and a "fourth transistor". The P-channel MOSFET 322 is an example of a "fifth transistor". The N-channel MOSFET 324 is an example of a "sixth transistor". As for the P-channel MOSFET 321, a supply voltage Vbat is supplied to the source, the drain and the gate are diode-connected and coupled to the gate of the P-channel MOSFET 323, the drain of the P-channel MOSFET 322, and the constant-current power supply IS1. As for the P-channel MOSFET 323, the supply voltage Vbat is supplied to the source, and the drain is coupled to the drain of the N-channel MOSFET 324 and the collector of the transistor Q2 of the bias current supply circuit 20 in the amplification unit 2. The constant-current power supply IS1 is coupled between the drain of the P-channel MOSFET 321 and GND. As such, the P-channel MOSFETs 321 and 323 form a current mirror circuit. As for the P-channel MOSFET 322, the power supply voltage Vbat is supplied to the source, and the gate is coupled to the output terminal of the inverter 311. As for the N-channel MOSFET 324, the drain is coupled to the drain of the P-channel MOSFET 323, the source is coupled to GND (grounded), and the gate is coupled to the input terminal of the inverter 311. The P-channel MOSFET 322 and the N-channel MOSFET 324 control supply of the output current Iec from the Iec current circuit 32 by using the level of voltage at the input terminal or output terminal of the inverter 311 of the circuit breaker circuit 31.

During normal operation (when overcurrent is not detected), the output voltage Vdet of the overcurrent detection circuit 30 (comparator 301) is at the level L, and thus, the input end of the inverter 311 is at the level L and the output end of the inverter 311 is at the level H. At this time, the P-channel MOSFET 322 is off because a signal of the level H is inputted to the gate of the P-channel MOSFET 322 from the output end of the inverter 311; the N-channel MOSFET 324 is off because a signal of the level L is inputted from the input end of the inverter 311 to the gate of the N-channel MOSFET 324. Thus, during normal operation, a current from the constant-current power supply IS1 flows in the P-channel MOSFET 321, and the same amount of mirror current flows in the P-channel MOSFET 323. Then, the mirror current is supplied to the collector of the transistor Q2 as the current Iec from the drain of the P-channel MOSFET 323.

When overcurrent is detected, the output voltage Vdet of the overcurrent detection circuit 30 (comparator 301) is at the level H, and thus, the input end of the inverter 311 is at the level H and the output end of the inverter 311 is at the level L. At this time, the P-channel MOSFET 322 is on because a signal of the level L is inputted to the gate of the P-channel MOSFET 322 from the output end of the inverter 311; the N-channel MOSFET 324 is on because a signal of the level H is inputted from the input end of the inverter 311 to the gate of the N-channel MOSFET 324. Since the P-channel MOSFET 322 is on, the gate voltage of the MOSFETs 321 and 323 is changed to the voltage Vbat; and as a result, the voltage difference between the gate and the source of the MOSFET 323 disappears and the MOSFET 323 is turned off. Since the N-channel MOSFET 324 is turned on, the drain of the MOSFET 323 establishes connection with GND. Thus, the current Iec is not supplied to the transistor Q2. When overcurrent is detected, the current Iec supplied from the drain of the P-channel MOSFET 323 to the transistor Q2 is 0 (A).

(1-3-4) Ibias Current Circuit 33

The Ibias current circuit 33 includes, for example, a constant-current power supply IS2, P-channel MOSFETs 331, 332, and 333, and an N-channel MOSFET 334. The P-channel MOSFETs 331 and 333 are an example of a "seventh transistor" and an "eighth transistor". The P-channel MOSFET 332 is an example of a "ninth transistor". The N-channel MOSFET 334 is an example of a "tenth transistor". As for the P-channel MOSFET 331, the supply voltage Vbat is supplied to the source, the drain and the gate are diode-connected and coupled to the gate of the P-channel MOSFET 333, the drain of the P-channel MOSFET 332, and the constant-current power supply IS2. As for the P-channel MOSFET 333, the supply voltage Vbat is supplied to the source, and the drain is coupled to the drain of the N-channel MOSFET 334 and also coupled to the base of the transistor Q2 and the collector and gate of the transistor QD1 via the resistance element R3 of the bias current supply circuit 20 in the amplification unit 2. The constant-current power supply IS2 is coupled between the drain of the P-channel MOSFET 331 and GND. As such, the P-channel MOSFETs 331 and 333 form a current mirror circuit. As for the P-channel MOSFET 332, the power supply voltage Vbat is supplied to the source, and the gate is coupled to the output terminal of the inverter 312. As for the N-channel MOSFET 334, the drain is coupled to the drain of the P-channel MOSFET 333, the source is coupled to GND (grounded), and the gate is coupled to the input terminal of the inverter 312. The P-channel MOSFET 332 and the N-channel MOSFET 334 control supply of the output current Ibias from the Ibias current circuit 33 by using the level of voltage at the input terminal or output terminal of the inverter 312 of the circuit breaker circuit 31.

During normal operation (when overcurrent is not detected), the output voltage Vdet of the overcurrent detection circuit 30 (comparator 301) is at the level L, and thus, the input end of the inverter 312 is at the level L and the output end of the inverter 312 is at the level H. At this time, the P-channel MOSFET 332 is off because a signal of the level H is inputted to the gate of the P-channel MOSFET 332 from the output end of the inverter 312; the N-channel MOSFET 334 is off because a signal of the level L is inputted from the input end of the inverter 312 to the gate of the N-channel MOSFET 334. Thus, during normal operation, a current from the constant-current power supply IS2 flows in the P-channel MOSFET 331, and the same amount of mirror current flows in the P-channel MOSFET 333. Then, the mirror current is supplied as the current Ibias from the drain of the P-channel MOSFET 333 to the base of the transistor QD1, the base of the transistor QD2, and the base of the transistor Q2 via the resistance element R3.

When overcurrent is detected, the output voltage Vdet of the overcurrent detection circuit 30 (comparator 301) is at the level H, and thus, the input end of the inverter 312 is at the level H and the output end of the inverter 312 is at the level L. At this time, the P-channel MOSFET 332 is on because a signal of the level L is inputted to the gate of the P-channel MOSFET 332 from the output end of the inverter 312; the N-channel MOSFET 334 is on because a signal of the level H is inputted from the input end of the inverter 312 to the gate of the N-channel MOSFET 334. Since the P-channel MOSFET 332 is on, the gate voltage of the MOSFETs 331 and 333 is changed to the voltage Vbat; and as a result, the voltage difference between the gate and the source of the MOSFET 333 disappears and the MOSFET 333 is turned off. Since the N-channel MOSFET 334 is turned on, the drain of the MOSFET 333 establishes connection with GND. Thus, the current Ibias is not supplied. When overcurrent is detected, the current Ibias supplied from the drain of the P-channel MOSFET 333 to the bias current supply circuit 20 is 0 (A).

When the bias current supply circuit 20 employs a voltage control method, the power amplifier circuit 1A may include, instead of the Ibias current circuit 33, a voltage control circuit for controlling bias voltage to be applied to the base of the transistor Q2.

(1-3-5) Current Draw Circuit 34

The current draw circuit 34 includes, for example, a constant-current power supply IS3, P-channel MOSFETs 341, 342, and 343, and an N-channel MOSFET 344. As for the P-channel MOSFET 341, the supply voltage Vbat is supplied to the source, the drain and the gate are diode-connected and coupled to the gate of the P-channel MOSFET 343, the drain of the P-channel MOSFET 342, and the constant-current power supply IS3. As for the P-channel MOSFET 343, the supply voltage Vbat is supplied to the source, and the drain is coupled to the drain of the N-channel MOSFET 344 and also coupled to the base of the transistor Q1 via the resistance element R4 of the bias current supply circuit 20 in the amplification unit 2. The constant-current power supply IS3 is coupled between the drain of the P-channel MOSFET 341 and the ground. As such, the P-channel MOSFETs 341 and 343 form a current mirror circuit. As for the P-channel MOSFET 342, the power supply voltage Vbat is supplied to the source, and the gate is coupled to the input terminal of the inverter 313. As for the N-channel MOSFET 344, the drain is coupled to the drain of the P-channel MOSFET 343, the source is coupled to GND (grounded), and the gate is coupled to the output terminal of the inverter 313. The P-channel MOSFET 342 and the N-channel MOSFET 344 control supply of the output current Ishut from the current draw circuit 34 by using the level of voltage at the input terminal or output terminal of the inverter 313 of the circuit breaker circuit 31.

During normal operation (when overcurrent is not detected), the output voltage Vdet of the overcurrent detection circuit 30 (comparator 301) is at the level L, and thus, the input end of the inverter 313 is at the level L and the output end of the inverter 313 is at the level H. At this time, the P-channel MOSFET 342 is on because a signal of the level L is inputted to the gate of the P-channel MOSFET 342 from the input end of the inverter 313; the N-channel MOSFET 344 is on because a signal of the level H is inputted from the output end of the inverter 313 to the gate of the N-channel MOSFET 344. Since the P-channel MOSFET 342 is on, the gate voltage of the MOSFETs 341 and 343 is changed to the voltage Vbat; and as a result, the voltage difference between the gate and the source of the MOSFET 343 disappears and the MOSFET 343 is turned off. Since the N-channel MOSFET 344 is turned on, the drain of the MOSFET 343 establishes connection with GND. Thus, the current Ishut is not supplied. During normal operation, the current Ishut supplied from the drain of the P-channel MOSFET 343 to the transistor Q1 is 0 (A).

When overcurrent is detected, the output voltage Vdet of the overcurrent detection circuit 30 (comparator 301) is at the level H, and thus, the input end of the inverter 313 is at the level H and the output end of the inverter 313 is at the level L. At this time, the P-channel MOSFET 342 is off because a signal of the level H is inputted to the gate of the P-channel MOSFET 342 from the input end of the inverter 313; the N-channel MOSFET 344 is off because a signal of the level L is inputted from the output end of the inverter 313 to the gate of the N-channel MOSFET 344. Thus, when overcurrent is detected, a current from the constant-current power supply IS3 flows in the P-channel MOSFET 341, and the same amount of mirror current flows in the P-channel MOSFET 343. Then, the mirror current is supplied as the current Ishut from the drain of the P-channel MOSFET 343 to the transistor Q1 via the resistance element R4. As a result, the transistor Q1 is turned on and draws the current Ib1 (collector current of the transistor Q1) from the bias current Ib2.

(2) Operation

Figure 3:
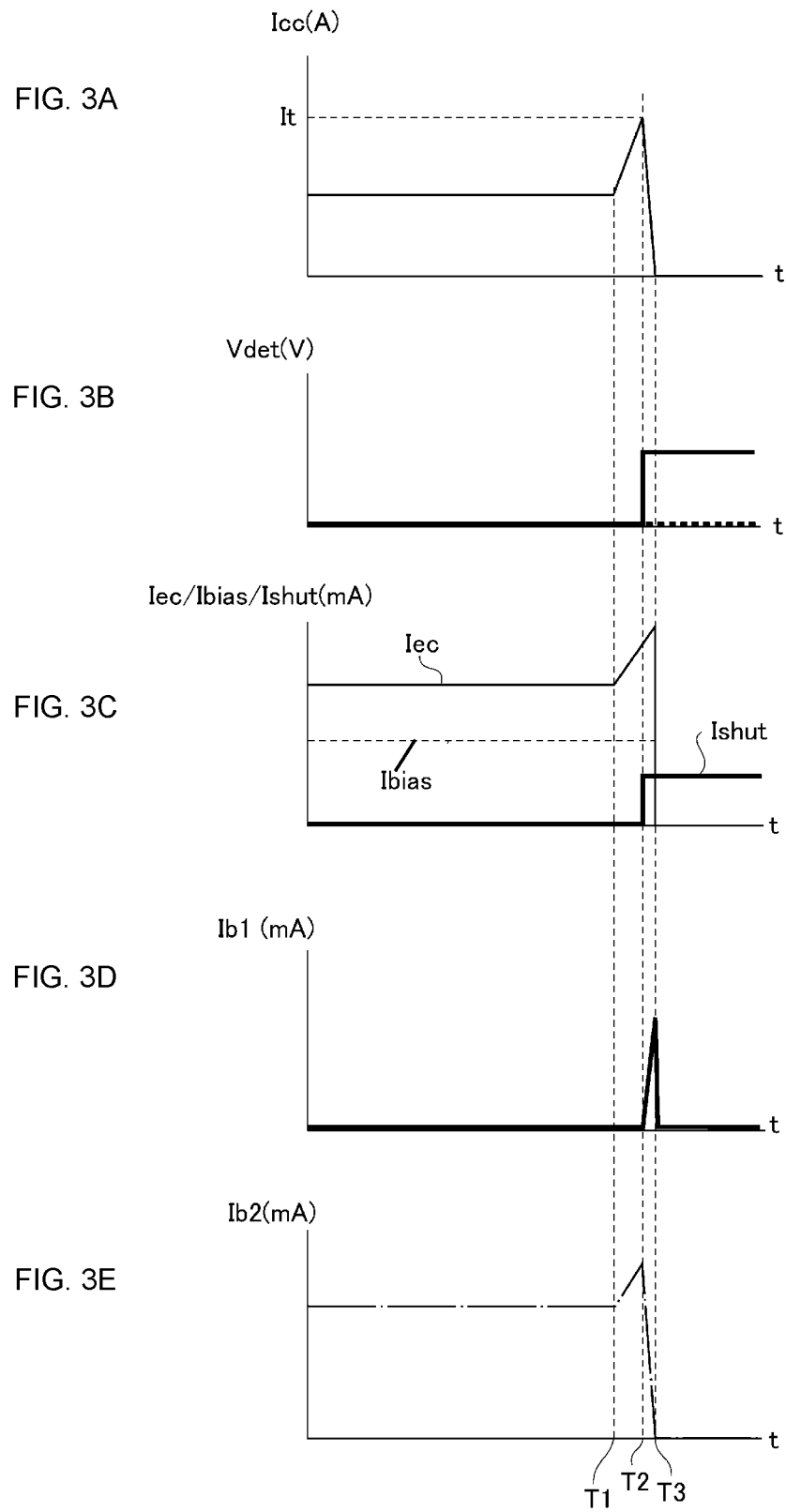
FIGS. 3A-3E are examples of timing charts illustrating an operation of the power amplifier circuit 1A according to the first embodiment.

FIGS. 3A-3E are examples of timing charts illustrating an operation of the power amplifier circuit 1A according to the first embodiment. FIG. 3A illustrates changes in the current Icc flowing in the current detection element R1 with respect to time. FIG. 3B illustrates changes in the output voltage Vdet of the overcurrent detection circuit 30 with respect to time. FIG. 3C illustrates changes in the current Iec supplied from the Iec current circuit 32, changes in the current Ibias supplied from the Ibias current circuit 33, and changes in the current Ishut supplied from the current draw circuit 34 with respect to time. FIG. 3D illustrates changes in the collector current Ib1 of the transistor Q1 with respect to time. FIG. 3E illustrates changes in the bias current Ib2 of the power amplifier Amp1 supplied from the transistor Q2 with respect to time.

(2-1) Before Time T1

It is assumed that during normal operation, which is a period before a time T1, the current Icc flowing from the supply voltage Vcc into the power amplifier Amp1 does not exceed a predetermined threshold It (A) for detecting overcurrent and remains at a given value (FIG. 3A). At this time, the output voltage Vdet of the overcurrent detection circuit 30 is 0 (V) that corresponds to the level L (FIG. 3B). As described above, the current Iec of a given amount from the Iec current circuit 32 and the current Ibias of a given amount from the Ibias current circuit 33 are supplied to the bias current supply circuit 20 (FIG. 3C). The current Ishut supplied from the current draw circuit 34 is 0 (A) (FIG. 3C). Since the current Ishut is 0 (A), the collector current Ib1 of the transistor Q1 is 0 (A), and the current drawn from the bias current Ib2 of the power amplifier Amp1 to the transistor Q1 side is 0 (A) (FIG. 3D). Since the current Iec and the current Ibias are supplied to the bias current supply circuit 20 as described above, the bias current Ib2 of a given amount is supplied from the collector of the transistor Q2 to the power amplifier Amp1 (FIG. 3E).

(2-2) Time T1 to T2

It is assumed that during the period in which excess current flows, which is a period from the time T1 to a time T2, as time elapses, the current Icc flowing in the power amplifier Amp1 caused by the supply voltage Vcc increases within a range below the predetermined threshold It (A) for detecting overcurrent (FIG. 3A). At this time, since the current Icc does not exceed the predetermined threshold It (A), the output voltage Vdet of the overcurrent detection circuit 30 still remains at the level L (FIG. 3B). As the current Icc increases, the bias current Ib2 flowing in the power amplifier Amp1 from the transistor Q2 increases (FIG. 3E), and the current Iec as the collector current of the transistor Q2 also increases (FIG. 3C). From the Ibias current circuit 33, the current Ibias of a given amount is supplied to the bias current supply circuit 20 (FIG. 3C). The current Ishut supplied from the current draw circuit 34 still remains at 0 (A) (FIG. 3C). Since the current Ishut is 0 (A), the collector current Ib1 of the transistor Q1 is 0 (A), and the current Ib1 drawn from the bias current Ib2 of the power amplifier Amp1 to the transistor Q1 side is also 0 (A) (FIG. 3D).

(2-3) Time T2 to T3

It is assumed that an overcurrent is detected at the time T2, and the current Icc reaches the predetermined threshold It(A) at the time T2. At this time, the output voltage Vdet of the overcurrent detection circuit 30 is inversely changed from the level L to the level H (FIG. 3B). Immediately after the output voltage Vdet of the overcurrent detection circuit 30 is inversely changed from the level L to the level H, the current Iec of a given amount from the Iec current circuit 32 and the current Ibias of a given amount from the Ibias current circuit 33 are still supplied to the bias current supply circuit 20 (FIG. 3C). At the same time, since the output voltage Vdet of the overcurrent detection circuit 30 is inversely changed from the level L to the level H as described above, the current Ishut of a given amount is supplied from the current draw circuit 34 to the base of the transistor Q1 (FIG. 3C). As a result, the current Ib1 starts flowing in the collector of the transistor Q1, and then, the current Ib1 increases as time elapses (FIG. 3D). The current Ib1 is gradually drawn from the transistor Q2 to the transistor Q1 side, and thus, the bias current Ib2 supplied from the transistor Q2 to the power amplifier Amp1 decreases as time elapses (FIG. 3E). Consequently, the current Icc flowing in the power amplifier Amp1 caused by the supply voltage Vcc also gradually decreases (FIG. 3A).

(2-4) After Time T3

At a time T3, the current Icc flowing in the power amplifier Amp1 from the supply voltage Vcc decreases to 0 (A) (FIG. 3A). In response to this, the current Iec supplied from the Iec current circuit 32 to the bias current supply circuit 20 and the current Ibias supplied from the Ibias current circuit 33 to the bias current supply circuit 20 both become 0 (A) (FIG. 3C). Additionally, the bias current Ib2 supplied from the transistor Q2 to the power amplifier Amp1 becomes 0 (A) (FIG. 3E) and the current Ib1 drawn from the bias current Ib2 of the power amplifier Amp1 to the transistor Q1 side becomes 0 (A) (FIG. 3D), and as a result, the power amplifier Amp1 stops operation.

As described above, in the power amplifier circuit 1A according to the first embodiment, when overcurrent is detected, the transistor Q1 directly draws the bias current Ib2 of the power amplifier Amp1, and thus, the operation speed of the protection function against overcurrent is improved.

Second Embodiment

Figure 4:
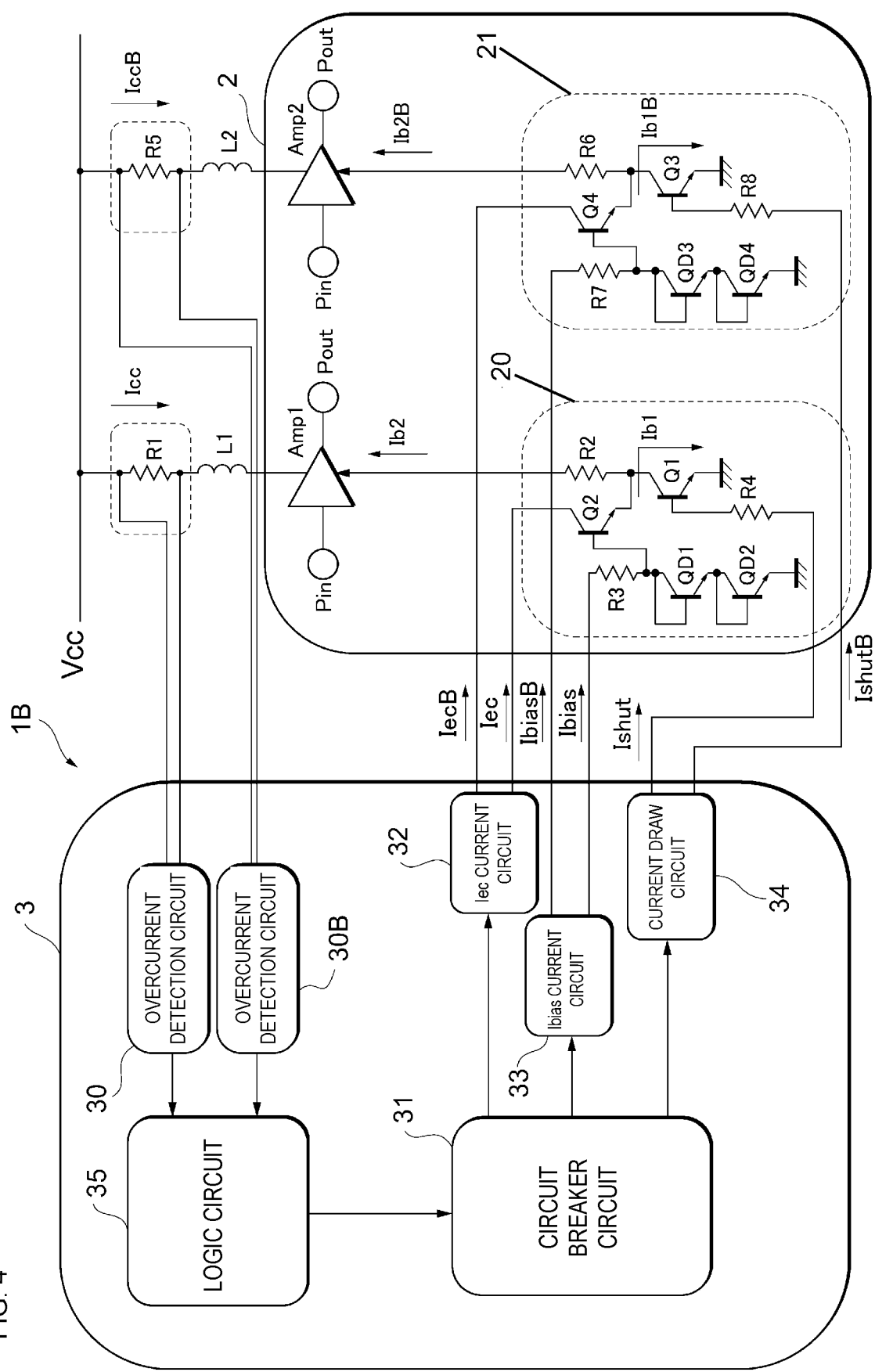
FIG. 4 illustrates an example of an overview of a circuit configuration of a power amplifier circuit 1B according to a second embodiment.

In a second embodiment, descriptions about specifics common to the first embodiment are not repeated and only different points will be explained. FIG. 4 illustrates an example of an overview of a circuit configuration of a power amplifier circuit 1B according to the second embodiment. The power amplifier circuit 1B according to the second embodiment has a configuration applicable to a two-band system using two kinds of frequency bands.

As illustrated in FIG. 4, the amplification unit 2 provided for the power amplifier circuit 1B further includes a power amplifier Amp2 and a bias current supply circuit 21. The power amplifier Amp1 and Amp2 respectively support different bands.

The power amplifier Amp2 (second amplifier) is constituted by, for example, a transistor. The supply voltage Vcc is supplied to the power amplifier Amp2 via a current detection element R5 and an inductor L2. A current IccB caused by the supply voltage Vcc flows in the power amplifier Amp2. The power amplifier Amp2 receives the input signal Pin of a radio frequency signal (RF signal), amplifies the signal, and accordingly outputs the output signal Pout.

The bias current supply circuit 21 (third bias current supply circuit) is a circuit for supplying a bias current Ib2B (third bias current) to the power amplifier Amp2. The bias current supply circuit 21 includes, for example, transistors Q3, Q4, QD3, and QD4 and resistance elements R6, R7, and R8.

As for the transistor Q4 (third transistor), the collector is coupled to the Iec current circuit 32, the emitter is coupled to the power amplifier Amp2 via the resistance element R6, and the base is coupled to the Ibias current circuit 33 via the resistance element R7. The Iec current circuit 32 supplies a collector current IecB to the transistor Q4, while the Ibias current circuit 33 supplies a base current IbiasB to the transistor Q4. The transistor Q4 supplies the bias current Ib2B from the emitter to the power amplifier Amp2 via the resistance element R6.

As for the transistor Q3 (fourth transistor), the collector is coupled between the transistor Q4 and the resistance element R6, the emitter is coupled to GND (grounded), and the base is coupled to the current draw circuit 34 via the resistance element R8. Under a predetermined condition, the current draw circuit 34 supplies a current IshutB to the base of the transistor Q3. When the current IshutB is supplied, the transistor Q3 turns on and draws a current Ib1B (collector current of the transistor Q3) from the bias current Ib2B to be supplied to the power amplifier Amp2.

As illustrated in FIG. 4, the control unit 3 provided for the power amplifier circuit 1B further includes an overcurrent detection circuit 30B (second current detection circuit) and a logic circuit 35. The overcurrent detection circuit 30B has the same configuration as the configuration of the overcurrent detection circuit 30. The overcurrent detection circuits 30 and 30B are each configured to detect overcurrent with respect to the collector current Icc of the power amplifier Amp1 and the collector current IccB of the power amplifier Amp2 and output a signal representing the detection result to the logic circuit 35. The logic circuit 35 receives the control signal and accordingly outputs an output signal about the overcurrent detection circuit 30 or 30B to the circuit breaker circuit 31.

As described above, the power amplifier circuit 1B according to the second embodiment has a configuration for detecting overcurrent with respect to individual bands, and as a result, it is possible to achieve protection against overcurrent with respect to individual bands.

Third Embodiment

Figure 5:
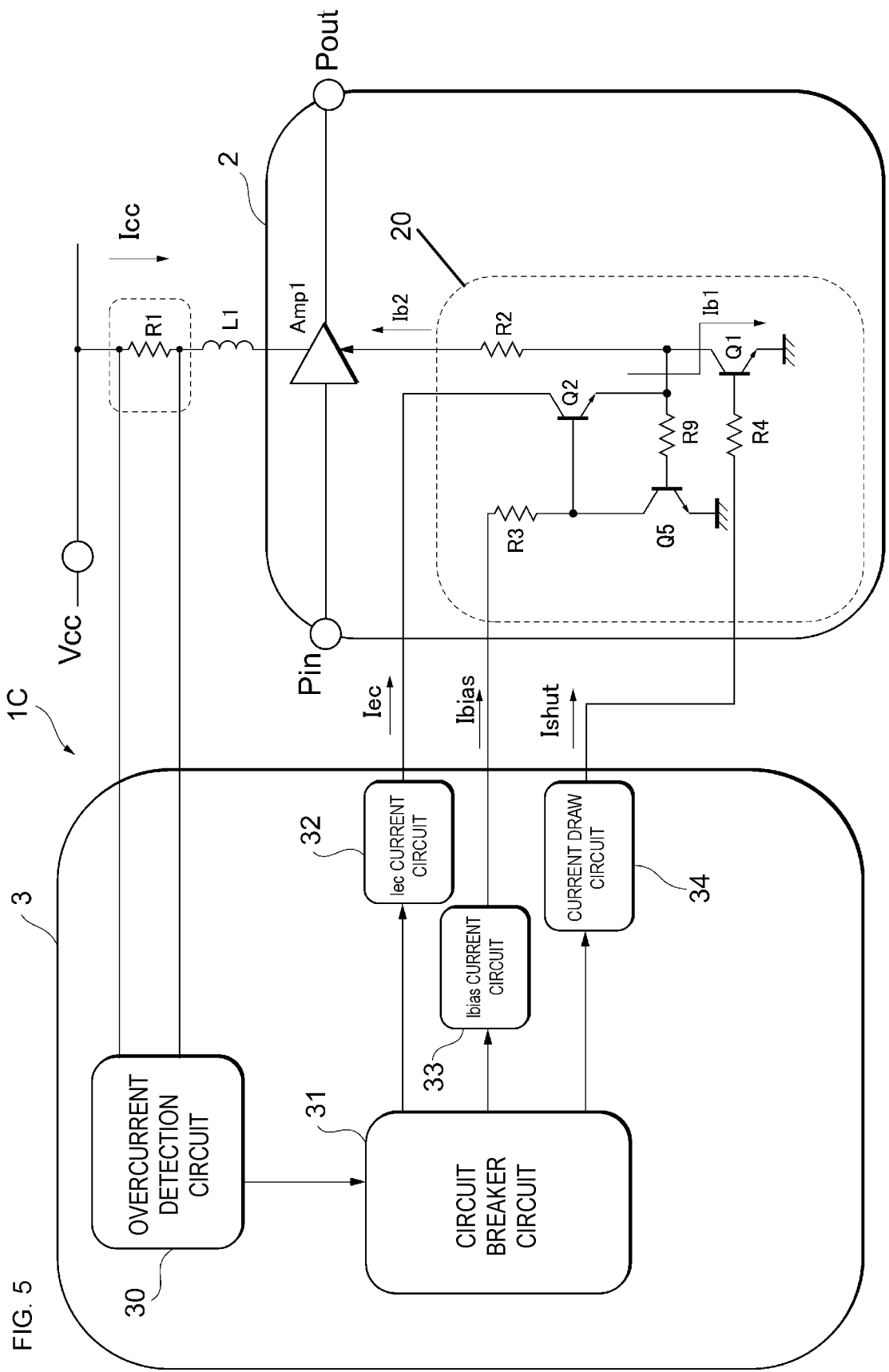
FIG. 5 illustrates an example of an overview of a circuit configuration of a power amplifier circuit 1C according to a third embodiment.

In a third embodiment, descriptions about specifics common to the first embodiment are not repeated and only different points will be explained. FIG. 5 illustrates an example of an overview of a circuit configuration of a power amplifier circuit 1C according to the third embodiment. The power amplifier circuit 1C according to the third embodiment differs from the power amplifier circuit 1A according to the first embodiment in the bias current supply circuit 20. While in the power amplifier circuit 1A according to the first embodiment the bias current supply circuit 20 is formed by coupling diodes in two stages, the bias current supply circuit 20 of the power amplifier circuit 1C according to the third embodiment employs a current mirror configuration.

The bias current supply circuit 20 of the power amplifier circuit 1C according to the third embodiment includes, instead of the transistors QD1 and QD2, a transistor Q5 and a resistance element R9, which is a configuration of a bias current supply circuit including a current mirror.

As for the transistor Q5 (fifth transistor), the collector is coupled to the other end of the resistance element R3 and the base of the transistor Q2, the base is coupled to one end of the resistance element R9, and the emitter is coupled to GND (grounded). As for the resistance element R9, one end is coupled to the base of the transistor Q5, and the other end is coupled to the emitter of the transistor Q2 and the collector of the transistor Q1. As such, the transistor Q5 and the power amplifier Amp1 establish current mirror connection.

Fourth Embodiment

Figure 6:
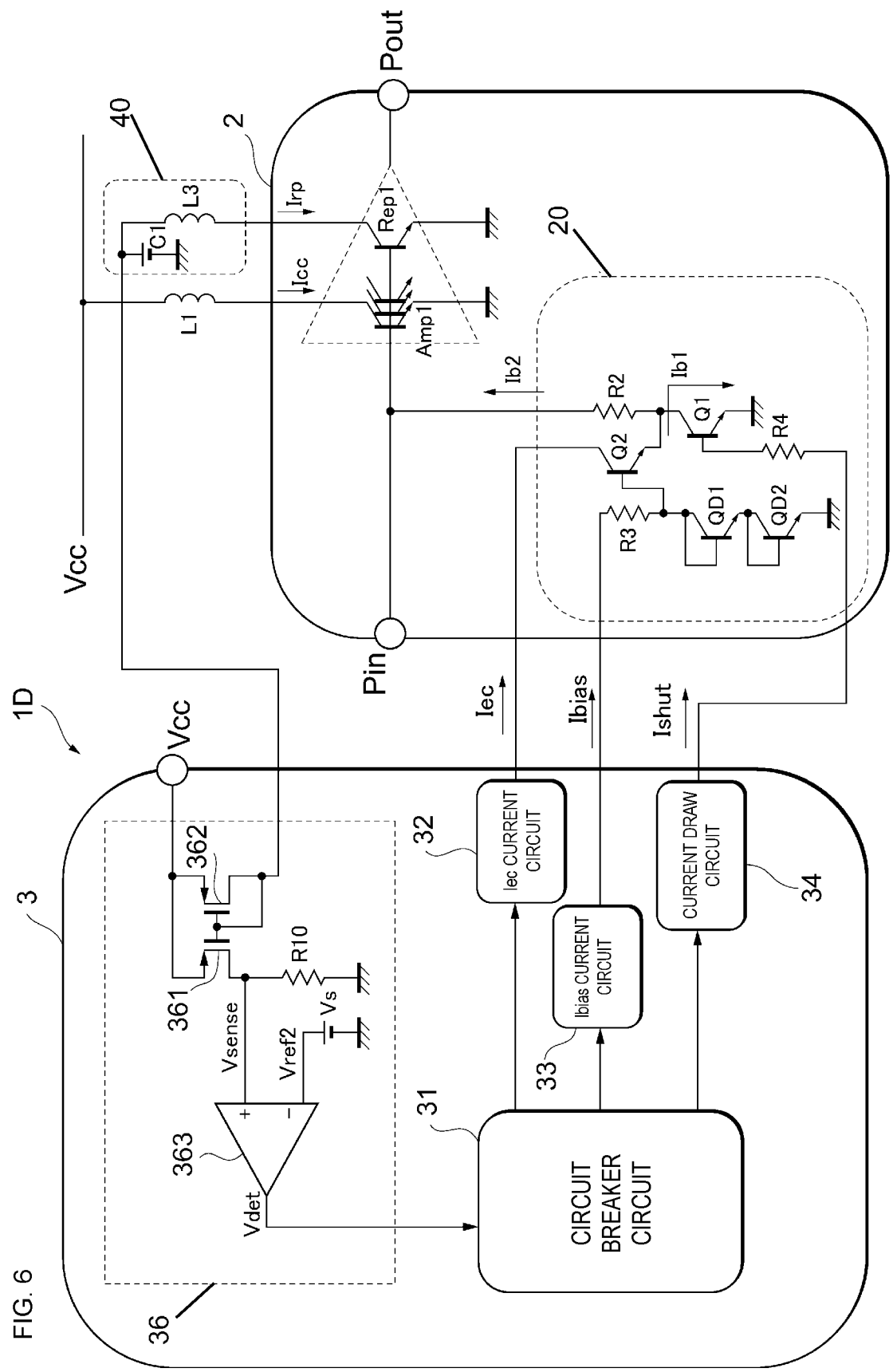
FIG. 6 illustrates an example of an overview of a circuit configuration of a power amplifier circuit 1D according to a fourth embodiment.

In a fourth embodiment, descriptions about specifics common to the first embodiment are not repeated and only different points will be explained. FIG. 6 illustrates an example of an overview of a circuit configuration of a power amplifier circuit 1D according to the fourth embodiment. The power amplifier circuit 1D according to the fourth embodiment differs from the power amplifier circuit 1A according to the first embodiment in the method of current detection. The power amplifier circuit 1D employs a method of detecting overcurrent by using a replica transistor Rep1 instead of the current detection element R1.

As illustrated in FIG. 6, the amplification unit 2 of the power amplifier circuit 1D according to the fourth embodiment includes the replica transistor Rep1. The replica transistor Rep1 is a transistor smaller (1/N as described later) than the power amplifier Amp1. The replica transistor Rep1 is, similarly to the transistor included in the power amplifier Amp1, a current amplification element (amplifier transistor) configured to amplify current inputted to the base. The replica transistor Rep1 detects a current Irp copying the collector current Icc of the power amplifier Amp1, such that the replica transistor Rep1 functions as a current detection element. The collector of the replica transistor Rep1 is coupled to the other end of an inductor L3 included in a low pass filter 40 described later. The collector current Irp flows in the collector of the replica transistor Rep1. The input signal Pin is inputted to the base of the replica transistor Rep1. A part of the bias current Ib2 is supplied to the base of the replica transistor Rep1 from the transistor Q2 via the resistance element R2.

As illustrated in FIG. 6, the power amplifier circuit 1D according to the fourth embodiment includes the low pass filter 40. The low pass filter 40 includes a capacitor C1 and the inductor L3. One end of the capacitor C1 is coupled to the drain of a P-channel MOSFET 362 of an overcurrent detection circuit 36 described later and one end of the inductor L3. The other end of the capacitor C1 is coupled to GND (grounded). One end of the inductor L3 is coupled to one end of the capacitor C1. The other end of the inductor L3 is coupled to the collector of the replica transistor Rep1.

As illustrated in FIG. 6, the control unit 3 of the power amplifier circuit 1D according to the fourth embodiment includes the overcurrent detection circuit 36. The overcurrent detection circuit 36 includes P-channel MOSFETs 361 and 362, a resistance element R10, a comparator 363, and a reference voltage source Vs. The P-channel MOSFET 362 is diode-connected. The supply voltage Vcc is supplied to the source of the P-channel MOSFET 362. The drain of the P-channel MOSFET 362 is coupled to the collector of the replica transistor Rep1 via the low pass filter 40. As for the P-channel MOSFET 361, the supply voltage Vcc is supplied to the source, the gate is coupled to the gate of the P-channel MOSFET 362, and the drain is coupled to a non-inverting input terminal of the comparator 363 and one end of the resistance element R10. As for the resistance element R10, one end is coupled to the non-inverting input terminal of the comparator 363 and the drain of the P-channel MOSFET 361, and the other end is coupled to GND (grounded). The reference voltage Vref2 is supplied to an inverting input terminal of the comparator 363 from the reference voltage source Vs.

The P-channel MOSFETs 361 and 362 establish current mirror connection. Thus, the collector current Irp flowing in the collector of the replica transistor Rep1 from the P-channel MOSFET 362 via the low pass filter 40 also flows in the P-channel MOSFET 361. The collector current Irp is converted into a voltage Vsense by the resistance element R10, and the voltage Vsense is supplied to the non-inverting input terminal of the comparator 363. The output terminal of the comparator 363 is coupled to the circuit breaker circuit 31. The comparator 363 outputs the voltage Vdet of the level H (High) or the level L (Low) in accordance with the comparison result obtained by comparing the voltage Vsense with the reference voltage Vref2.

Here, the size and function of the replica transistor Rep1 is described. The size ratio of the transistor included in the power amplifier Amp1 to the replica transistor Rep1 is configured as N:1. Here, it is assumed that N is a real number sufficiently larger than 1 so that the collector current Icc of the transistor included in the power amplifier Amp1 is sufficiently larger than the collector current Irp of the replica transistor Rep1. Specifically, for example, when the transistor included in the power amplifier Amp1 and the replica transistor Rep1 both have a multi-emitter structure, the ratio of the number of unit transistors included in the transistor of the power amplifier Amp1 to the number of unit transistors included in the replica transistor Rep1 may be set as N:1. Alternatively, for example, when the transistor included in the power amplifier Amp1 and the replica transistor Rep1 both have a single-emitter structure, the ratio of the size (emitter size) of the transistor of the power amplifier Amp1 to the size (emitter size) of the replica transistor Rep1 may be set as N:1.

In this case, the ratio of the collector current Icc of the transistor included in the power amplifier Amp1 to the collector current Irp of the replica transistor Rep1 is almost identical to the size ratio (N:1) of the two transistors. This means that the two transistors are almost identical to each other with respect to the current density. Thus, by detecting the collector current Irp of the replica transistor Rep1, it is possible to detect the collector current Icc of the transistor included in the power amplifier Amp1.

As described above, in the power amplifier circuit 1D according to the fourth embodiment, overcurrent is detected by detecting the collector current Irp of the replica transistor Rep1 with the use of the overcurrent detection circuit 36, and in accordance with the detection result, the protection function against overcurrent is performed.

Fifth Embodiment

Figure 7:
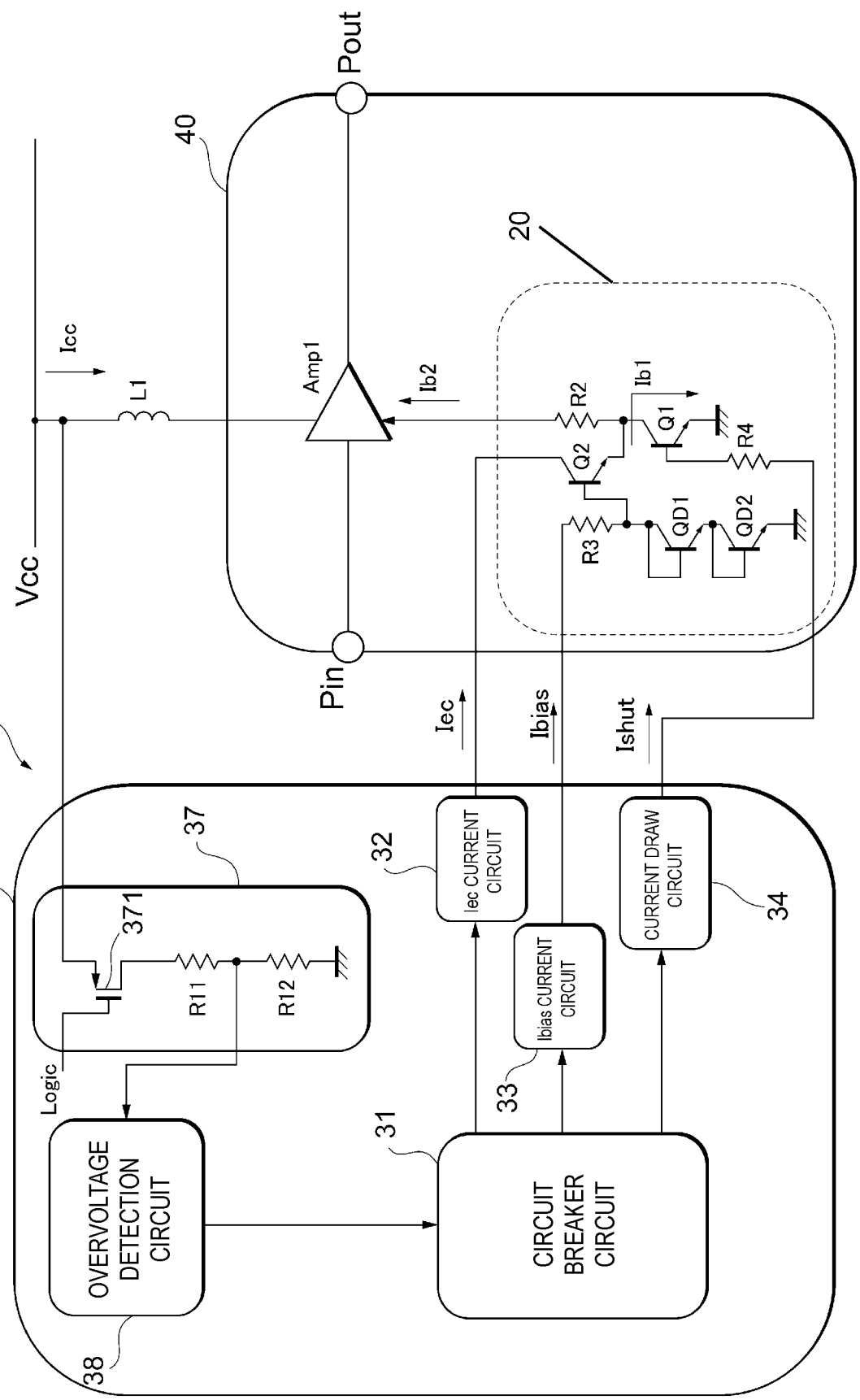
FIG. 7 illustrates an example of an overview of a circuit configuration of a power amplifier circuit 1E according to a fifth embodiment.

In a fifth embodiment, descriptions about specifics common to the first embodiment are not repeated and only different points will be explained. FIG. 7 illustrates an example of an overview of a circuit configuration of a power amplifier circuit 1E according to the fifth embodiment.

As illustrated in FIG. 7, the control unit 3 of the power amplifier circuit 1E according to the fifth embodiment includes an attenuator circuit 37 and an overvoltage detection circuit 38. The power amplifier circuit 1E according to the fifth embodiment detects overvoltage of the collector voltage of the power amplifier and protects the power amplifier against the overvoltage.

The attenuator circuit 37 includes a P-channel MOSFET 371 and resistance elements R11 and R12. As for the P-channel MOSFET 371, a collector voltage of the power amplifier Amp1 is supplied to the source, the gate is configured to receive a control signal Logic, and the drain is coupled to one end of the resistance element R11. The other end of the resistance element R11 is coupled to one end of the resistance element R12. The other end of the resistance element R12 is coupled to GND (grounded). A voltage between the resistance elements R11 and R12 is supplied to the overvoltage detection circuit 38. This means that the collector voltage of the power amplifier Amp1 is supplied to the resistance elements R11 and R12 via the P-channel MOSFET 371 and divided by the resistance elements R11 and R12; and a divided voltage is supplied to the overvoltage detection circuit 38.

The overvoltage detection circuit 38 receives from the attenuator circuit 37 the divided voltage of the collector voltage of the power amplifier Amp1, compares the divided voltage with a predetermined reference voltage, and outputs a signal representing the comparison result to the circuit breaker circuit 31.

As described above, in the power amplifier circuit 1E according to the fifth embodiment, when overvoltage is detected, the transistor Q1 directly draws the bias current Ib2 of the power amplifier Amp1, and thus, the operation speed of the protection function against overvoltage is improved.

While the power amplifier circuit 1E does not perform amplification operation, the P-channel MOSFET 371 is turned off by being controlled in accordance with the control signal Logic. As a result, while the power amplifier circuit 1E does not perform amplification operation, it is possible to interrupt the current caused by the supply voltage Vcc not to flow in the resistance elements R11 and R12.

[Circuit Configuration of Overcurrent Detection Circuit 30]

Figure 8:
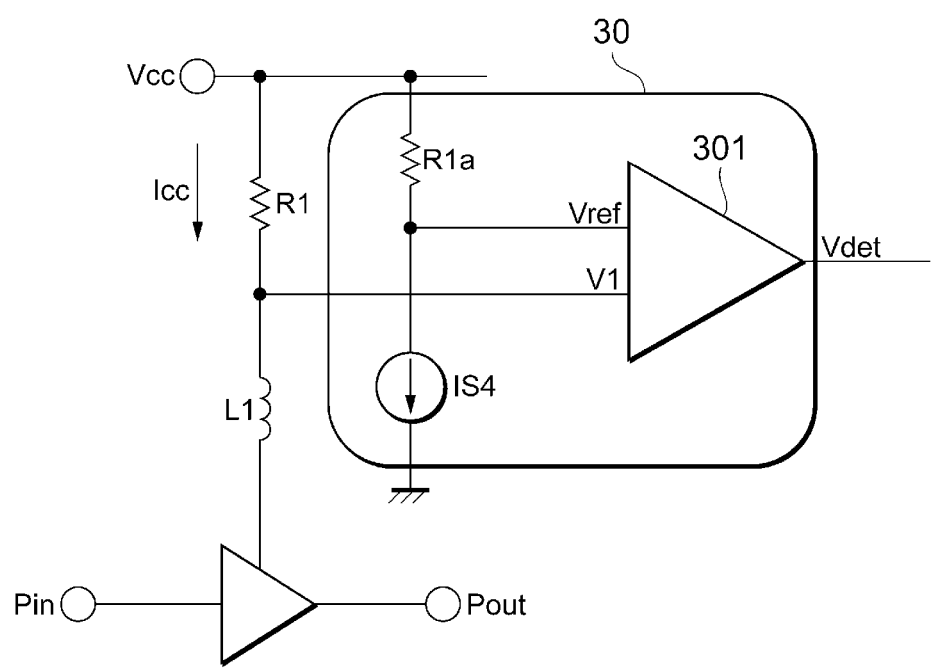
FIG. 8 illustrates an example of a configuration of an overcurrent detection circuit 30 included in a control unit 3.

FIG. 8 illustrates an example of an overview of a circuit configuration of the overcurrent detection circuit 30 provided for the power amplifier circuit 1A according to the first embodiment of FIG. 1. The overcurrent detection circuit 30 includes the comparator 301 configured to compare a detected voltage V1 obtained by converting a current flowing in the power amplifier Amp1 and detected by the current detection element R1 into voltage with the reference voltage Vref, a resistance element R1a configured to generate the reference voltage Vref, and a constant-current power supply IS4. As illustrated in FIG. 8, an inverting input terminal of the comparator 301 is coupled between the resistance element R1a configured to generate the reference voltage and the constant-current power supply IS4. The other end of the constant-current power supply IS4 is coupled to GND (grounded). The other end of the resistance element R1a configured to generate the reference voltage is connected to the supply voltage Vcc. The non-inverting input terminal of the comparator 301 is coupled between the current detection element R1 and the inductor L1.

[Operation of Overcurrent Detection Circuit 30]

Figure 9:
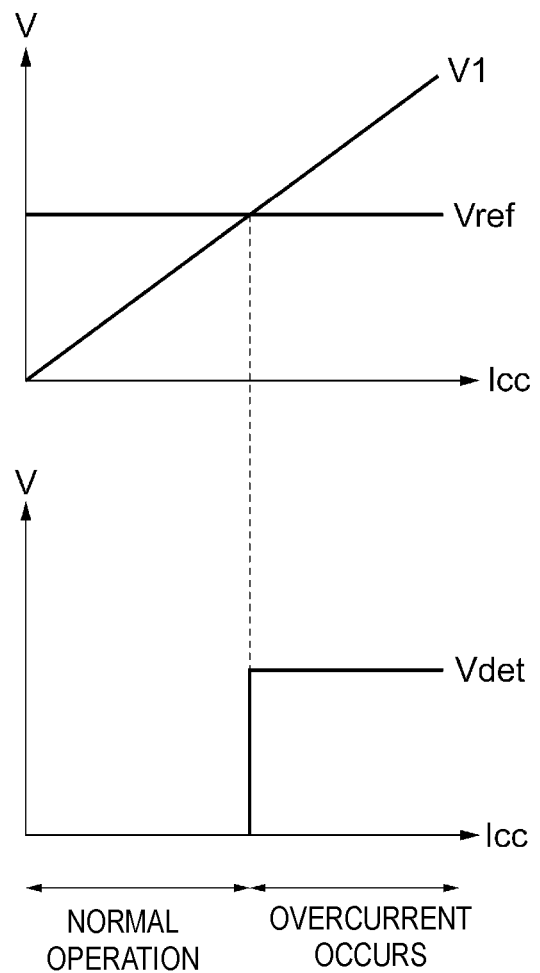
FIG. 9 is an example of timing charts illustrating an operation of the overcurrent detection circuit 30 included in the control unit 3.

FIG. 9 illustrates the voltage Vref and the voltage V1 at the input terminal of the overcurrent detection circuit 30 and the voltage Vdet at the output terminal of the overcurrent detection circuit 30 during the period in which overcurrent occurs and the period of normal operation. The reference voltage Vref can be expressed as: Vref=Vcc−(R1a×IS4). The detected voltage V1 can be expressed as: V1=Vcc−(R1×Icc). In the operation of the overcurrent detection circuit 30, when overcurrent occurs, V1>Vref, and thus, the comparator 301 outputs the output Vdet of the level H (High). During normal operation, V1<Vref, and thus, the comparator 301 outputs the output Vdet of the level L (Low).

The embodiments described above have been made for ease of understanding the present disclosure and should not be construed to limit the present disclosure. The elements included in the embodiments, the arrangements thereof, materials, conditions, shapes, sizes, and the like are not limited to the examples and may be changed as appropriate. The configurations presented in the different embodiments can be partially replaced or combined with each other.

Various embodiments of the present disclosure have been described above. A power amplifier circuit according to an embodiment of the present disclosure includes an amplifier configured to amplify a radio frequency signal and output the radio frequency signal, a bias current supply circuit configured to supply a bias current to the amplifier, a detection circuit configured to detect whether the voltage supplied to the amplifier is equal to or greater than a predetermined threshold; and a draw circuit configured to, when the detection circuit detects that the current or voltage is equal to or greater than the predetermined threshold, draw at least a part of the bias current supplied to the amplifier.

In this aspect, when overcurrent or overvoltage is detected, the draw circuit directly draws the bias current supplied from the bias current supply circuit to the amplifier so as to stop the operation of the amplifier, and as a result, the operation speed of the protection function against overcurrent or overvoltage is improved.

Furthermore, in the power amplifier circuit, the bias current supply circuit may include a first transistor and may be configured to supply the bias current to the amplifier from the emitter or source of the first transistor.

With this configuration, when overcurrent or overvoltage is detected, the draw circuit directly draws the bias current supplied from the first transistor to the amplifier, and as a result, the operation speed of the protection function against overcurrent or overvoltage is improved.

Further, in the power amplifier circuit, the draw circuit may include a second transistor, and the collector or drain of the second transistor may be coupled to the emitter or source of the first transistor.

With this configuration, the second transistor draws the bias current supplied from the first transistor to the amplifier, and as a result, the operation speed of the protection function against overcurrent or overvoltage is improved.

Moreover, the power amplifier circuit may include a collector current supply circuit for supplying a current to the collector of the first transistor. The collector current supply circuit may be configured to, when the detection circuit detects that the current or voltage of the amplifier is equal to or greater than the predetermined threshold, interrupt the current not to be supplied to the collector of the first transistor.

With this configuration, the collector current of the first transistor of the bias current supply circuit is controlled, and as a result, it is possible to control the bias current supplied from the first transistor to the amplifier.

Furthermore, the power amplifier circuit may include a second bias current supply circuit configured to supply a second bias current to the base of the first transistor. The second bias current supply circuit may be configured to, when the detection circuit detects that the current or voltage of the amplifier is equal to or greater than a predetermined threshold, interrupt the second bias current.

With this configuration, the bias current or voltage applied to the base of the first transistor of the bias current supply circuit is controlled, and as a result, it is possible to control the bias current supplied from the first transistor to the amplifier.

Further, in the power amplifier circuit, the detection circuit may include a detection element configured to detect the current or voltage of the amplifier and a comparison circuit configured to compare the current or voltage detected by the detection element with the predetermined threshold and output a comparison result.

With this configuration, it is possible to improve the operation speed of the protection function against overcurrent or overvoltage with a simple configuration.

Moreover, in the power amplifier circuit, the detection circuit may include a replica transistor having the collector configured to receive an inflow current corresponding in amount to the current of the amplifier, a replica current detection element configured to detect the current flowing into the collector of the replica transistor, and a second comparison circuit configured to compare the current flowing into the collector of the replica transistor and detected by the replica current detection element with a predetermined second threshold and output a comparison result.

With this configuration, it is possible to improve the operation speed of the protection function against overcurrent or overvoltage with a simple configuration.

Furthermore, the power amplifier circuit may further include a second amplifier configured to amplify a radio frequency signal and output the radio frequency signal, a third bias current supply circuit configured to supply a third bias current to the second amplifier, a second detection circuit configured to detect whether the current or voltage of the second amplifier is equal to or greater than a predetermined second threshold, and a second draw circuit configured to, when the second detection circuit detects that the current or voltage of the second amplifier is equal to or greater than the predetermined second threshold, draw at least a part of the third bias current supplied to the second amplifier.

With this configuration, the power amplifier circuit can be applied to systems using multiple bands.

REFERENCE SIGNS LIST 1A, 1B, 1C, 1D, 1E power amplifier circuit, 2 amplification unit, 20, 21 bias current supply circuit, 3 control unit, 30, 30B overcurrent detection circuit, 31 circuit breaker circuit, 32 Iec current circuit, 33 Ibias current circuit, 34 current draw circuit, 35 logic circuit, 36 overcurrent detection circuit 2, 37 attenuator circuit, 311-313 inverter, 321-323, 331-333, 341-343, 361, 362, 371 P-channel MOSFET, 324, 334, 344 N-channel MOSFET, Amp1, 2 power amplifier, Q1, Q2, Q3, Q4, Q5, QD1, QD2, QD3, QD4 transistor, R1-12, R1a resistance element, L1-L3 inductor, C1 capacitor, IS1-4 constant-current power supply, Vs reference voltage source

The invention claimed is:

1. A power amplifier circuit comprising:
an amplifier configured to amplify a radio frequency signal and to output an amplified radio frequency signal;
a bias current supply circuit comprising a first transistor configured to supply a bias current to the amplifier;
a detection circuit configured to detect whether a current or a voltage of the amplifier is equal to or greater than a predetermined threshold; and
a second transistor connected between the first transistor and ground,
wherein a collector or a drain of the second transistor is connected to an emitter or a source of the first transistor, and an emitter or a source of the second transistor is connected to ground.

2. The power amplifier circuit according to claim 1, further comprising a collector current supply circuit configured to:
supply a current to a collector of the first transistor, and
when the detection circuit detects that the current or the voltage of the amplifier is equal to or greater than the predetermined threshold, stop the current supply to the collector of the first transistor.

3. The power amplifier circuit according to claim 1, further comprising:
a collector current supply circuit configured to supply a current to a collector of the first transistor, wherein the collector current supply circuit comprises:
a current mirror circuit comprising a third transistor and a fourth transistor;
a fifth transistor connected between a supply voltage and the third and fourth transistors; and
a sixth transistor connected between the third transistor or the fourth transistor, and ground.

4. The power amplifier circuit according to claim 3, further comprising:
an inverter connected to the collector current supply circuit,
wherein a base or a gate of the fifth transistor is connected to an output terminal of the inverter, and
wherein a base or a gate of the sixth transistor is connected to an input terminal of the inverter.

5. The power amplifier circuit according to claim 1, further comprising a second bias current supply circuit configured to:
supply a second bias current to a base of the first transistor; and
when the detection circuit detects that the current or voltage of the amplifier is equal to or greater than the predetermined threshold, stop supplying the second bias current.

6. The power amplifier circuit according to claim 1, further comprising:
a second bias current supply circuit configured to supply a second bias current to a base of the first transistor, wherein the second bias current supply circuit comprises:
a current mirror circuit comprising a seventh transistor and an eighth transistor;
a ninth transistor connected between a supply voltage and the seventh and eighth transistors; and
a tenth transistor connected between the seventh transistor or the eighth transistor, and ground.

7. The power amplifier circuit according to claim 6, further comprising:
an inverter connected to the second bias current supply circuit,
wherein a base or a gate of the ninth transistor is connected to an output terminal of the inverter, and
wherein a base or a gate of the tenth transistor is connected to an input terminal of the inverter.

8. The power amplifier circuit according to claim 1, wherein the detection circuit comprises:
a resistor configured to detect the current or the voltage of the amplifier, and
a comparison circuit configured to compare the current or the voltage detected by the resistor to the predetermined threshold, and to output a comparison result.

9. The power amplifier circuit according to claim 1, wherein the detection circuit comprises:
a replica transistor having a collector configured to receive an inflow current corresponding to a current of the amplifier;
a replica resistor configured to detect the inflow current of the replica transistor; and
a second comparison circuit configured to compare the inflow current of the replica transistor and detected by the replica resistor to a predetermined second threshold, and to output a comparison result.

10. The power amplifier circuit according to claim 1, wherein the amplifier comprises a heterojunction bipolar transistor.

11. The power amplifier circuit according to claim 1, further comprising:
a second amplifier configured to amplify a second radio frequency signal and to output a second amplified radio frequency signal;
a third bias current supply circuit configured to supply a third bias current to the second amplifier;
a second detection circuit configured to detect whether a current or a voltage of the second amplifier is equal to or greater than a predetermined second threshold; and
a second draw circuit configured to, when the second detection circuit detects that the current or the voltage of the second amplifier is equal to or greater than the predetermined second threshold, draw at least a part of the third bias current supplied to the second amplifier.

12. A power amplifier circuit comprising:
an amplifier configured to amplify a radio frequency signal and to output an amplified radio frequency signal;
a bias current supply circuit comprising a first transistor configured to supply a bias current to the amplifier;

a detection circuit configured to detect whether a current or a voltage of the amplifier is equal to or greater than a predetermined threshold; and a draw circuit configured to, when the detection circuit detects that the current or the voltage is equal to or greater than the predetermined threshold, draw at least a part of the bias current supplied to the amplifier, and a collector current supply circuit configured to:
supply a current to a collector of the first transistor, and
when the detection circuit detects that the current or the voltage of the amplifier is equal to or greater than the predetermined threshold, stop the current supply to the collector of the first transistor.

13. The power amplifier circuit according to claim 12, wherein the first transistor is configured to supply the bias current to the amplifier from an emitter or a source of the first transistor.

14. The power amplifier circuit according to claim 13, wherein the draw circuit comprises a second transistor, and a collector or a drain of the second transistor is connected to the emitter or the source of the first transistor.

* * * * *